(12) United States Patent
Poncelet et al.

(10) Patent No.: US 9,981,336 B2
(45) Date of Patent: May 29, 2018

(54) RIBBON BONDING TOOLS, AND METHODS OF DESIGNING RIBBON BONDING TOOLS

(71) Applicant: Orthodyne Electronics Corporation, Wilmington, DE (US)

(72) Inventors: Bernard Poncelet, Costa Mesa, CA (US); Todd James Walker, Huntington Beach, CA (US); Christoph Benno Luechinger, Irvine, CA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 51 days.

(21) Appl. No.: 15/338,948

(22) Filed: Oct. 31, 2016

(65) Prior Publication Data
US 2017/0120372 A1 May 4, 2017

Related U.S. Application Data

(60) Provisional application No. 62/250,694, filed on Nov. 4, 2015.

(51) Int. Cl.
| | |
|---|---|
| *B23K 37/00* | (2006.01) |
| *B23K 20/00* | (2006.01) |
| *B23K 26/361* | (2014.01) |
| *H01L 23/00* | (2006.01) |
| *B23K 101/20* | (2006.01) |

(52) U.S. Cl.
CPC .......... *B23K 20/004* (2013.01); *B23K 26/361* (2015.10); *H01L 24/85* (2013.01); *B23K 2201/20* (2013.01); *H01L 2224/45014* (2013.01); *H01L 2224/7898* (2013.01)

(58) Field of Classification Search
CPC ............... B23K 20/004; B23K 26/361; B23K 2201/20; B23K 20/10–20/106; B23K 1/06; B23K 20/005; B23K 20/007; H01L 2224/7898; H01L 2224/45014; H01L 24/85; H01L 24/86

USPC .............. 228/110.1, 1.1, 4.5, 180.5, 904; 156/580.1–580.2
See application file for complete search history.

(56) References Cited

U.S. PATENT DOCUMENTS

| | | | | |
|---|---|---|---|---|
| 4,970,365 A | * | 11/1990 | Chalco ................. | B23K 1/0056 219/121.63 |
| 5,153,981 A | * | 10/1992 | Soto ................... | H01L 21/67144 29/701 |

(Continued)

FOREIGN PATENT DOCUMENTS

| | | |
|---|---|---|
| JP | 2014112581 | 6/2014 |
| KR | 20110132779 | 12/2011 |

OTHER PUBLICATIONS

International Search Report for International Patent Application No. PCT/US2016/059675, dated Jan. 31, 2017.

*Primary Examiner* — Kiley Stoner
(74) *Attorney, Agent, or Firm* — Christopher M. Spletzer, Sr.

(57) ABSTRACT

A ribbon bonding tool is provided. The ribbon bonding tool includes a body portion including a tip portion, the tip portion defining a working surface. The ribbon bonding tool includes a group of four protrusions extending from the working surface, wherein the working surface defines four quadrants in a horizontal plane by extending an imaginary line at a midpoint along each of a length and a width of the working surface. Each of the four protrusions is arranged in one of four quadrants.

20 Claims, 13 Drawing Sheets

(56) References Cited

U.S. PATENT DOCUMENTS

| | | | |
|---|---|---|---|
| 5,180,093 A * | 1/1993 | Stansbury | B23K 20/106 228/1.1 |
| 5,868,301 A * | 2/1999 | Distefano | B23K 20/025 228/1.1 |
| 7,745,253 B2 | 6/2010 | Luechinger | |
| 7,838,101 B2 | 11/2010 | Delsman et al. | |
| 8,685,789 B2 | 4/2014 | Luechinger | |
| 8,685,791 B2 | 4/2014 | Luechinger | |
| 8,820,609 B2 | 9/2014 | Walker | |
| 2004/0129755 A1 | 7/2004 | Macover | |
| 2005/0218188 A1* | 10/2005 | Lee | B23K 20/005 228/4.5 |
| 2005/0279811 A1 | 12/2005 | Bell | |
| 2009/0001135 A1* | 1/2009 | Kishimoto | B23K 20/10 228/110.1 |
| 2012/0097339 A1* | 4/2012 | Hull | B29C 65/08 156/580.1 |
| 2013/0119111 A1 | 5/2013 | Delsman et al. | |
| 2014/0190638 A1* | 7/2014 | Hull | B65B 51/225 156/580.2 |
| 2014/0338842 A1* | 11/2014 | Hull | B65B 51/225 156/580.2 |
| 2015/0090405 A1* | 4/2015 | Hull | B29C 66/1122 156/580.2 |
| 2015/0290873 A1* | 10/2015 | Hull | B29C 66/43 156/580.2 |

* cited by examiner

RIBBON BONDING TOOLS, AND METHODS OF DESIGNING RIBBON BONDING TOOLS

CROSS-REFERENCE TO RELATED APPLICATION

This application claims the benefit of U.S. Provisional Application No. 62/250,694, filed Nov. 4, 2015, the contents of which are incorporated herein by reference.

FIELD

The invention relates to the ultrasonic bonding, and more particularly, to improved bonding tools for bonding conductive wire and ribbon material.

BACKGROUND

In the semiconductor packaging industry, and other industries requiring electrical interconnection, wire and ribbon bonding are widely adopted technologies. In connection with wire and ribbon bonding operations, various types of energy (e.g., ultrasonic energy, thermosonic energy, thermocompressive energy, etc.) are used to bond an end portion of wire/ribbon to a first bonding location. After a first bond is formed at the first bonding location, a length of wire/ribbon is extended to second bonding location, and then a second bond is formed at the second bonding location.

As opposed to conventional wire bonding (e.g., ball bonding and wedge bonding of a wire having a round cross section), ribbon bonding typically involves bonding a flexible conductive ribbon material (e.g., having a rectangular cross section) between bonding locations. Exemplary conductive materials used in ribbon bonding include aluminum (Al) ribbon material, copper (Cu) ribbon material, aluminum copper clad ribbon material (Al—Cu), amongst others. Exemplary ribbon bonding techniques, and packages including conductive ribbon, are disclosed in U.S. Pat. No. 7,745,253, U.S. Pat. No. 8,685,789, and U.S. Pat. No. 8,685,791. Exemplary ribbon bonding tools are disclosed in U.S. Pat. No. 7,838,101 and U.S. Pat. No. 8,820,609.

A challenge in ribbon bonding is extending the usable life (e.g., in number of bonds) of a ribbon bonding tool. Extending the useful life of the tool is particularly challenging in applications involving Cu ribbon material, Al—Cu ribbon material, etc.

Thus, it would be desirable to provide improved ribbon bonding tools, and methods of designing ribbon bonding tools.

SUMMARY

According to an exemplary embodiment of the invention, a ribbon bonding tool is provided. The ribbon bonding tool includes a body portion including a tip portion, the tip portion defining a working surface. The ribbon bonding tool includes a group of four protrusions extending from the working surface, wherein the working surface defines four quadrants (e.g., see Quadrants 1, 2, 3, and 4 in FIG. 2C) in a horizontal plane by extending an imaginary line at a midpoint along each of a length and a width of the working surface (e.g., see imaginary "Length line" at the midpoint of the length, and imaginary "Width line" at the midpoint of the width, in FIG. 2C). Each of the four protrusions is arranged in one of four quadrants (or each of the four protrusions being at least partially in a respective one of the four quadrants).

According to another exemplary embodiment of the invention, a ribbon bonding tool is provided. The ribbon bonding tool includes a body portion including a tip portion, the tip portion defining a working surface. The ribbon bonding tool includes a group of four protrusions extending from the working surface. Each of the four protrusions are arranged equidistant (or substantially equidistant) from a center point (e.g., see center point in FIG. 2C) of the working surface.

According to another exemplary embodiment of the invention, a method of designing a ribbon bonding tool is provided. The method includes: (a) determining locations for each of four protrusions on a working surface of the ribbon bonding tool such that the four protrusions will have substantially similar wear characteristics over a predetermined period of time; (b) determining shapes for each of the four protrusions such that each of the four protrusions will have a substantially similar wear characteristic along its specific length over the predetermined period of time; and (c) forming the ribbon bonding tool to have shapes of the four protrusions determined in step (b) at the locations determined in step (a).

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures.

DETAILED DESCRIPTION

A factor contributing to the reduced lifetime of certain ribbon bonding tools is the uneven wear across the bond foot (including the working surface) of the ribbon bonding tool. In accordance with certain exemplary embodiments of the invention, ribbon bonding tools are provided including protrusions/structures at locations on the working surface (i.e., extending from a working surface of the bonding tool) where the wear rate is similar, and to avoid having protrusions/structures at certain locations on the bond foot (e.g., the center of the working surface).

Such ribbon bonding tools may have a substantially increased usable lifetime (e.g., measured in number of bonds)—wherein during the useable lifetime the geometry of the contact portion of the bonding tool (the portion that contacts the ribbon material during bonding) remains within a specific range of the geometry at time zero (i.e., at a time when zero bonds have been formed with the ribbon bonding tool). During the useable lifetime, the bond process behavior and result remain within a specific window, with deviations from the results at time zero less than a predetermined tolerance.

As provided above, the protrusions/structures on the working surface may desirably be arranged at locations where they encounter similar wear rates. Certain locations (e.g., unique locations, such as the center/midpoint of the working surface) have no such protrusion. The protrusions/structures are shaped such that the local wear rate across the protrusions/structures themselves is within a predetermined tolerance of one another, such that the protrusions do not change their shape significantly during their usable lifetime.

Figure 1A:
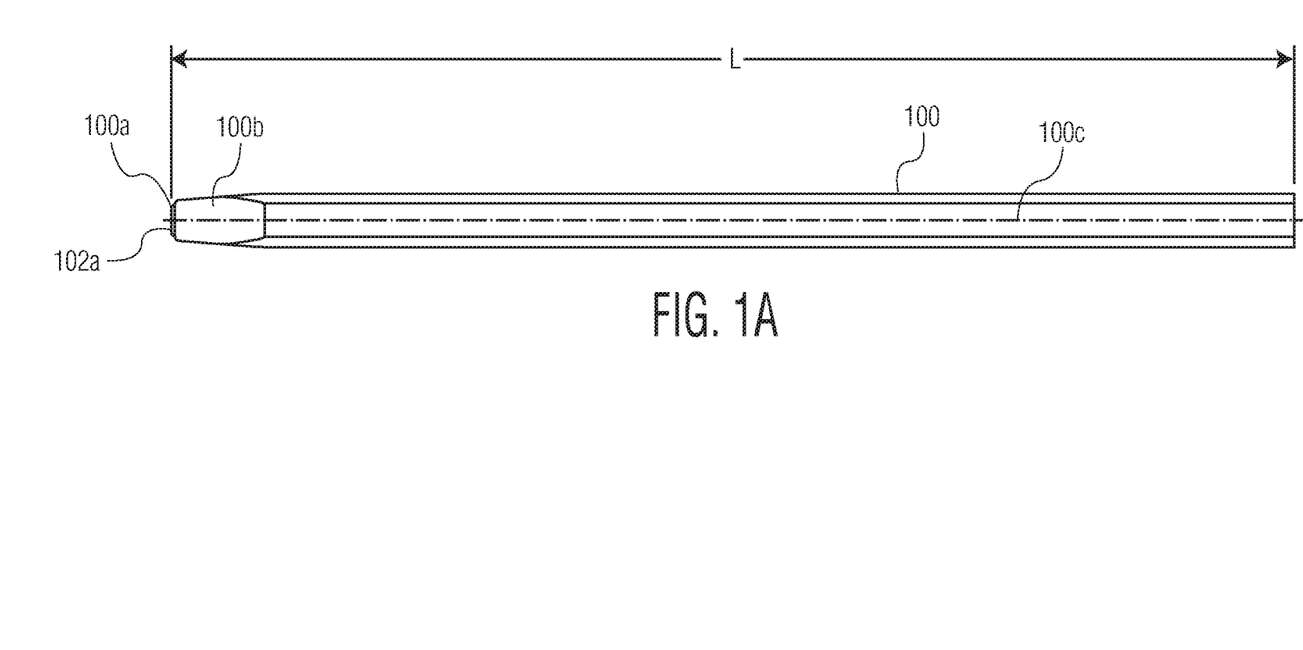
FIGS. 1A-1B are front and side view diagrams of a ribbon bonding tool in accordance with an exemplary embodiment of the invention.
Figure 1B:
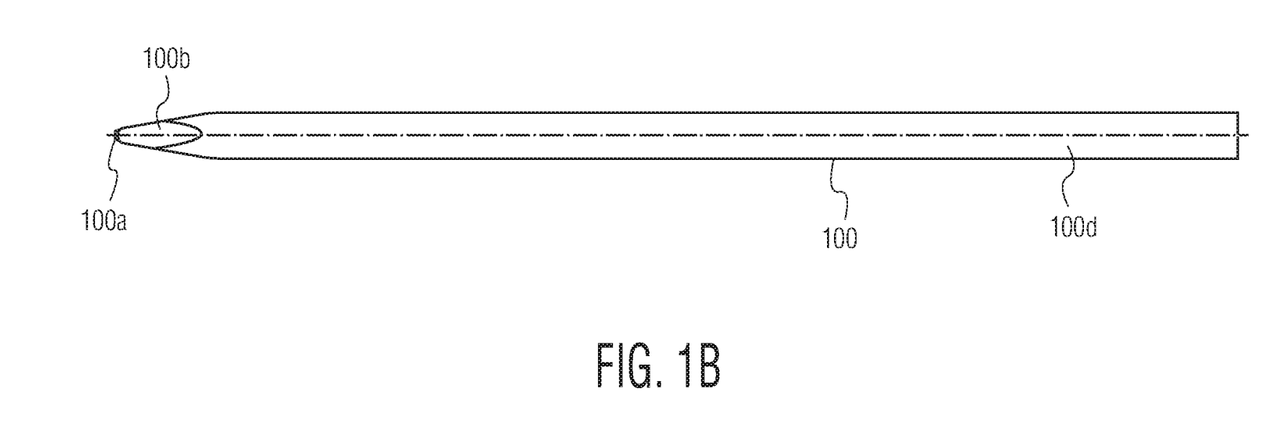

FIGS. 1A-1B are front and side views of a ribbon bonding tool 100 (FIG. 1A illustrates a front 100c of a body portion of ribbon bonding tool 100, and FIG. 1B illustrates a side 100d of the body portion of ribbon bonding tool 100). At an end of the body portion of ribbon bonding tool 100 is tip portion 100b. Tip portion 100b defines a working surface 100a. A group of four protrusions 102a extend from working surface 100a.

FIGS. 2A-2E, 3A-3E, 4A-4E, 5A-5E, and 6A-6E are examples of ribbon bonding tools 100. That is, each of FIGS. 2A-2E, 3A-3E, 4A-4E, 5A-5E, and 6A-6E illustrate a respective tip portion 100b (i.e., 100b1, 100b2, 100b3, 100b4, and 100b5).

Figure 2A:
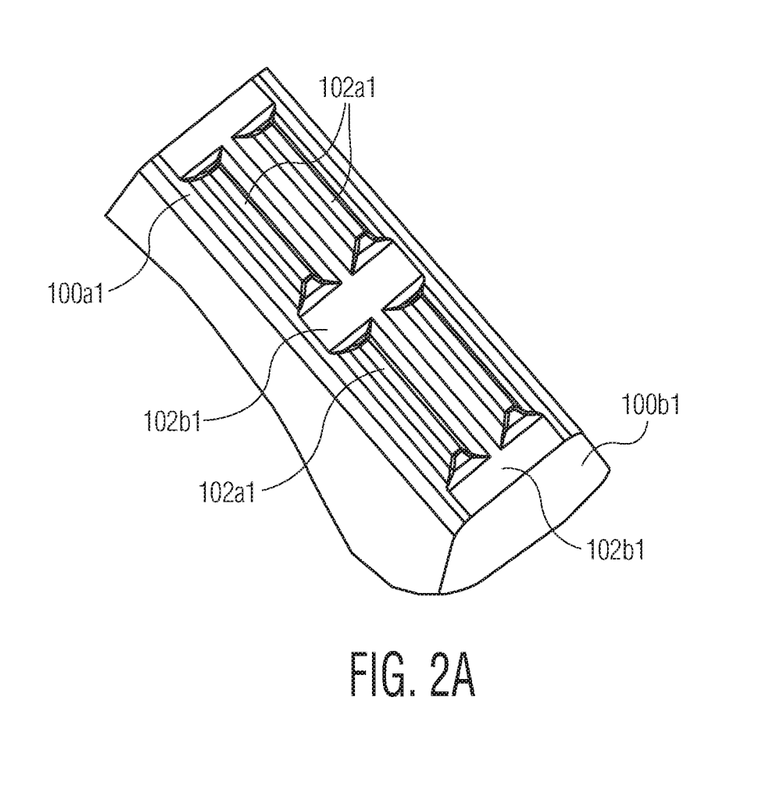
FIGS. 2A-2E are various views of a tip portion of a ribbon bonding tool in accordance with an exemplary embodiment of the invention.
Figure 2B:
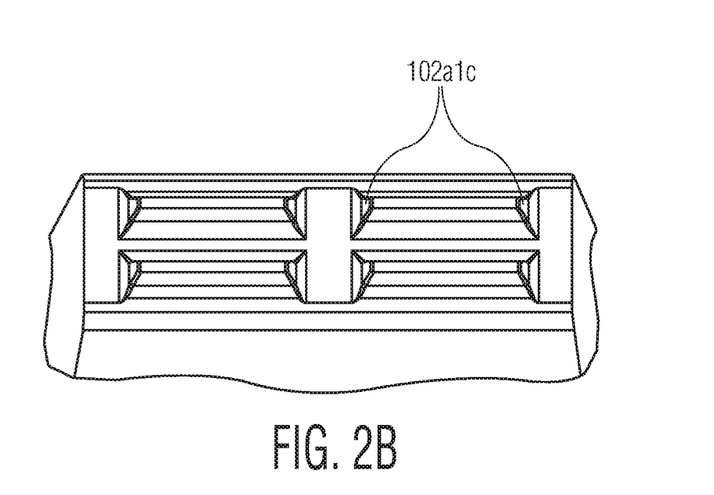
Figure 2C:
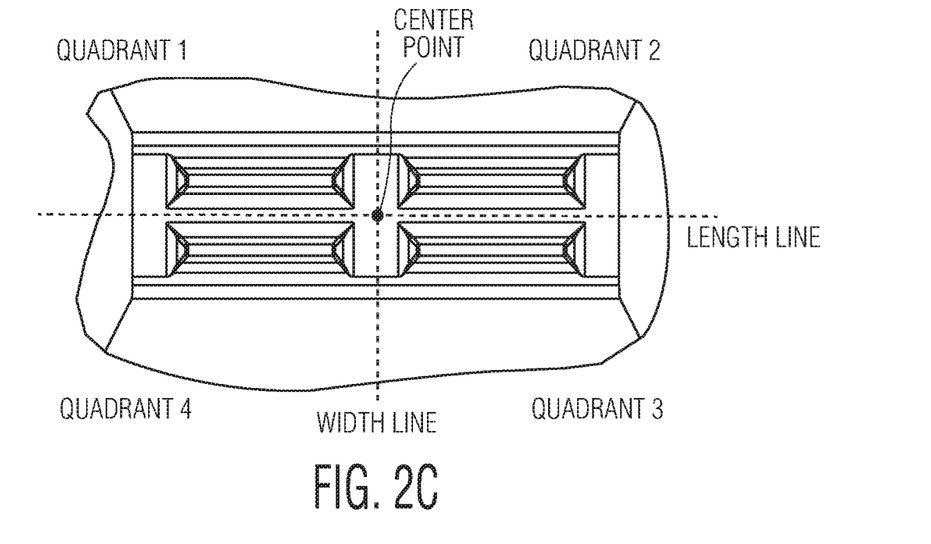
Figure 2D:
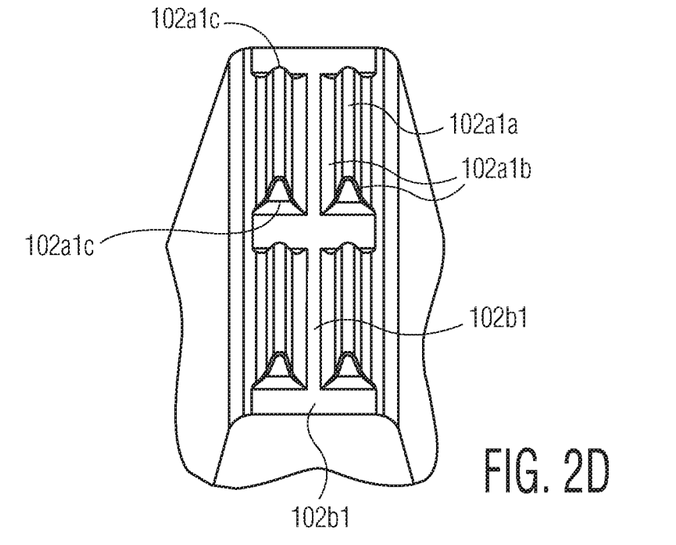
Figure 2E:
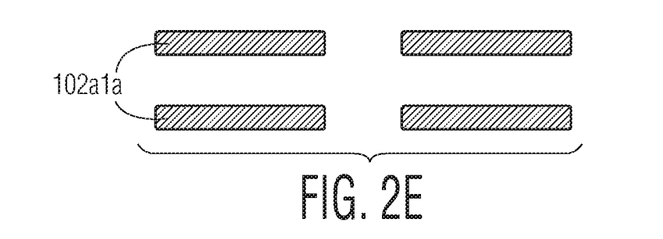
Figure 3A:
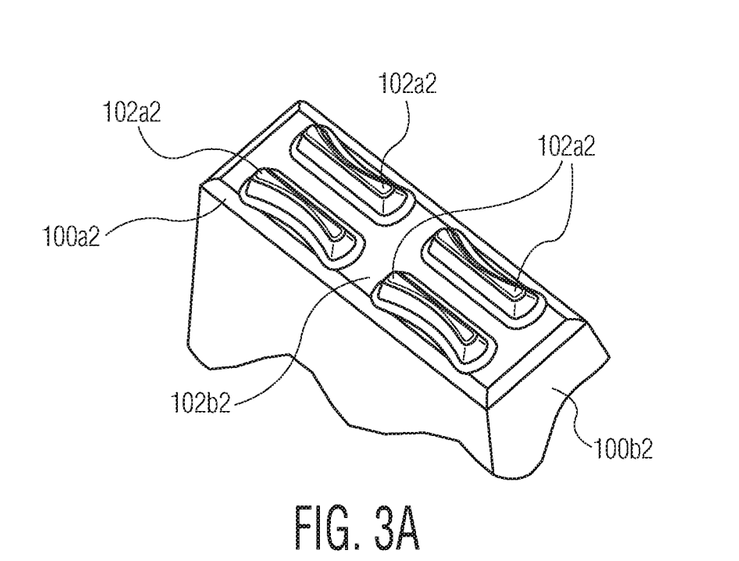
FIGS. 3A-3E are various views of a tip portion of another ribbon bonding tool in accordance with an exemplary embodiment of the invention.
Figure 3B:
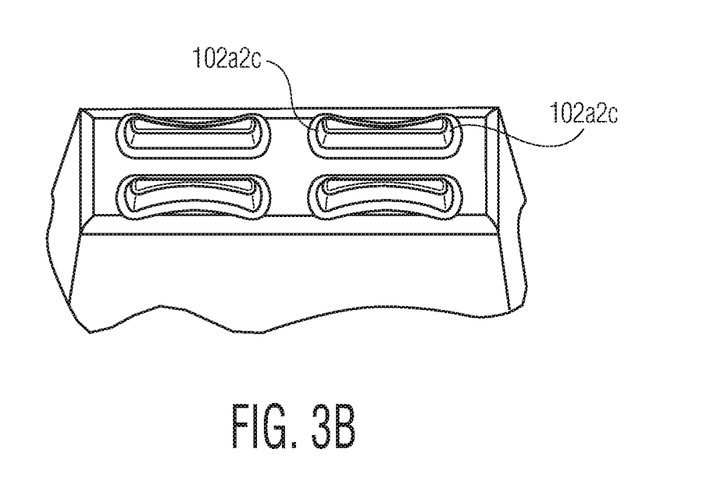
Figure 3C:
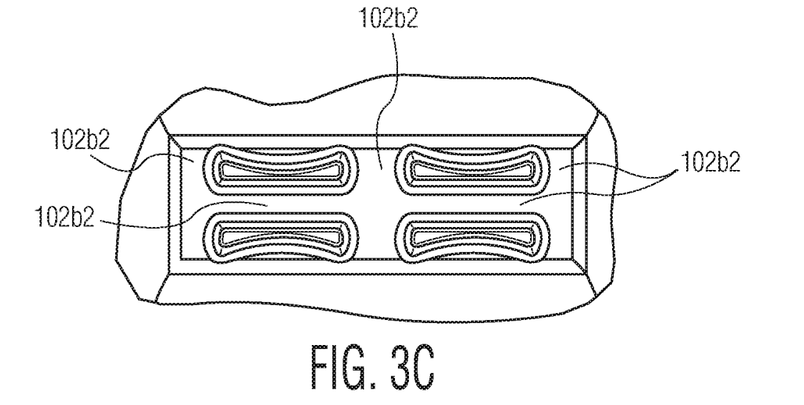
Figure 3D:
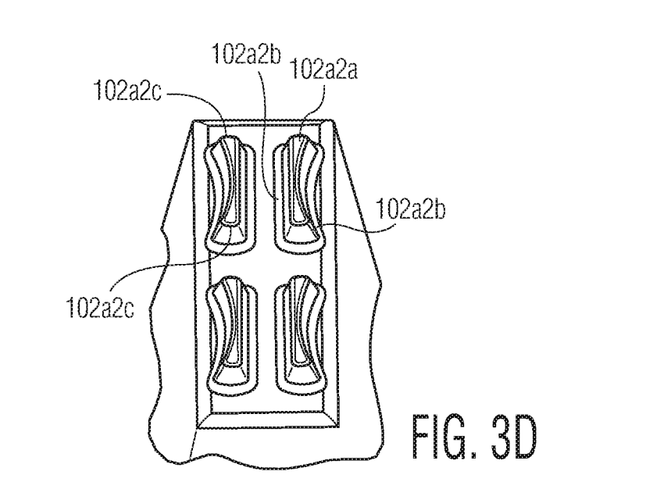
Figure 3E:
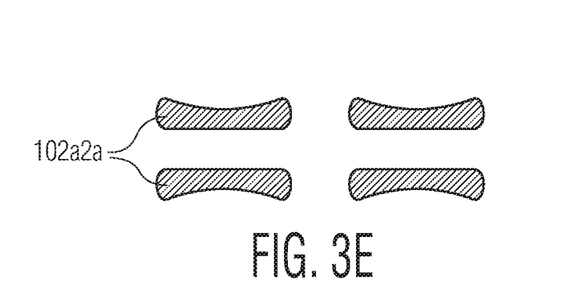
Figure 4A:
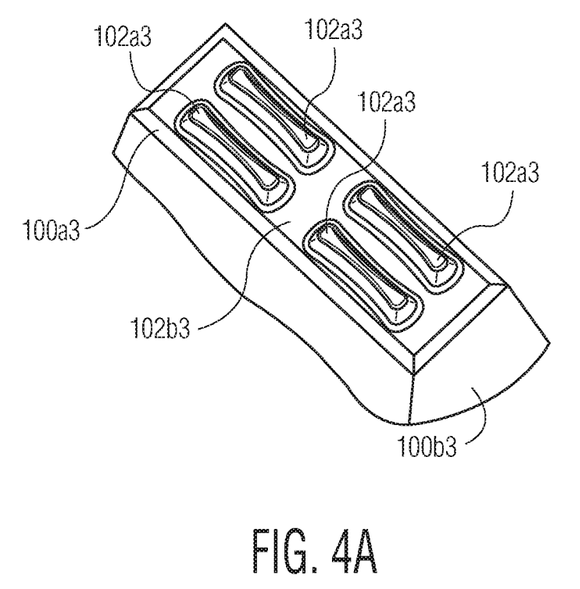
FIGS. 4A-4E are various views of a tip portion of yet another ribbon bonding tool in accordance with an exemplary embodiment of the invention.
Figure 4B:
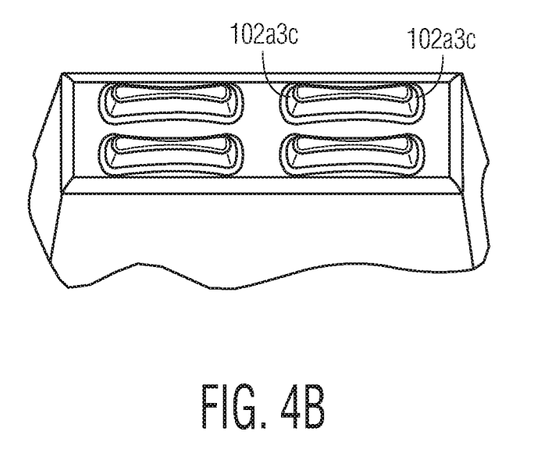
Figure 4C:
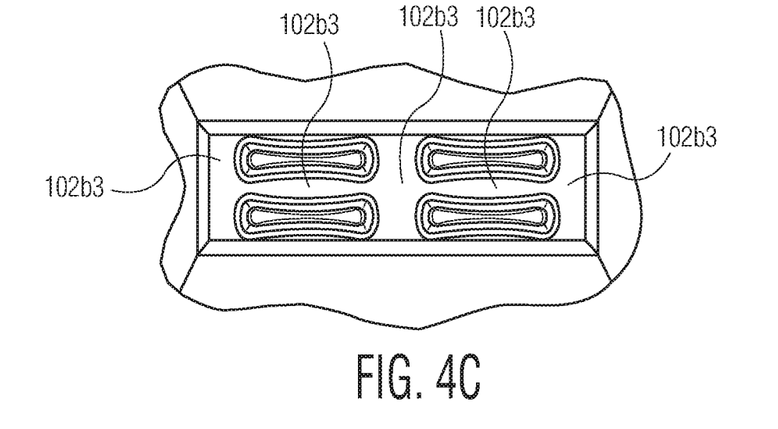
Figure 4D:
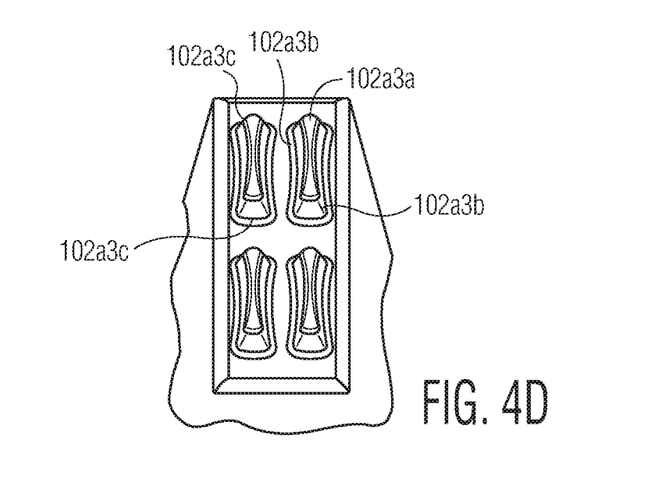
Figure 4E:
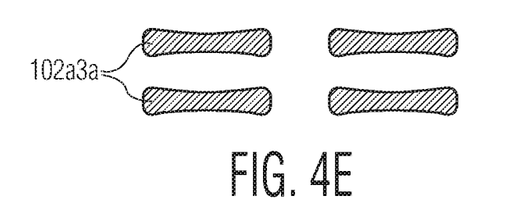
Figure 5A:
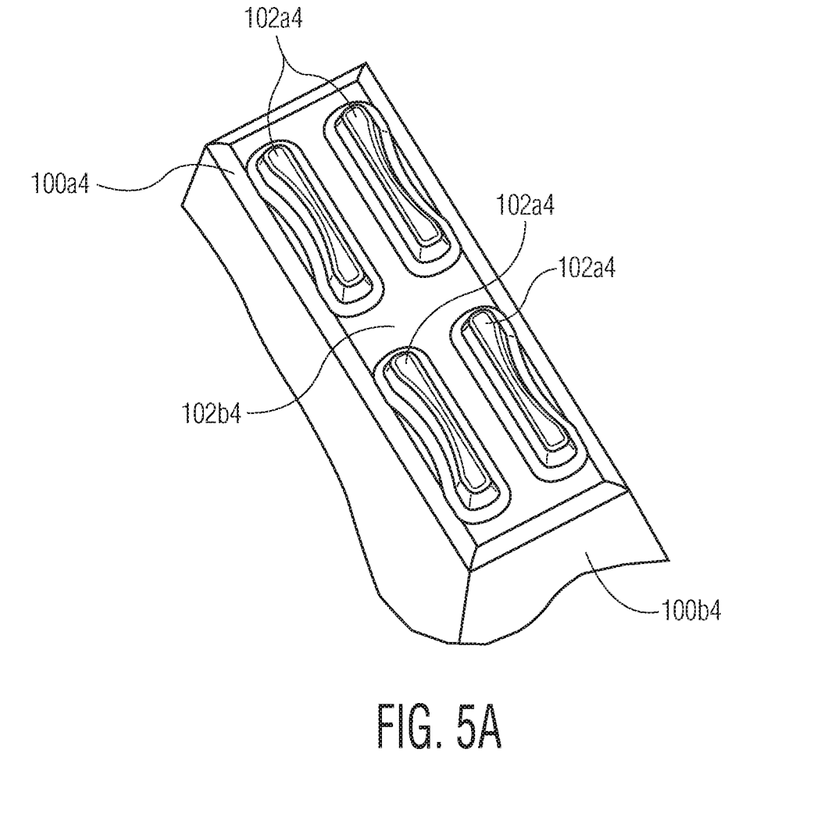
FIGS. 5A-5E are various views of a tip portion of yet another ribbon bonding tool in accordance with an exemplary embodiment of the invention.
Figure 5B:
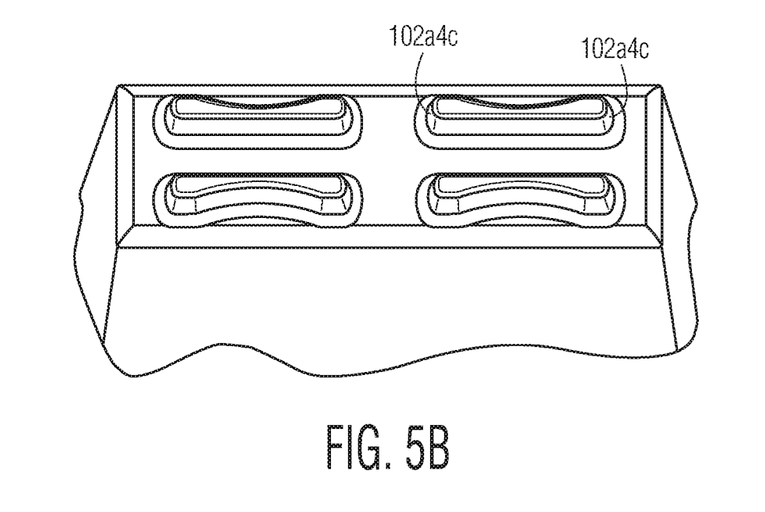
Figure 5C:
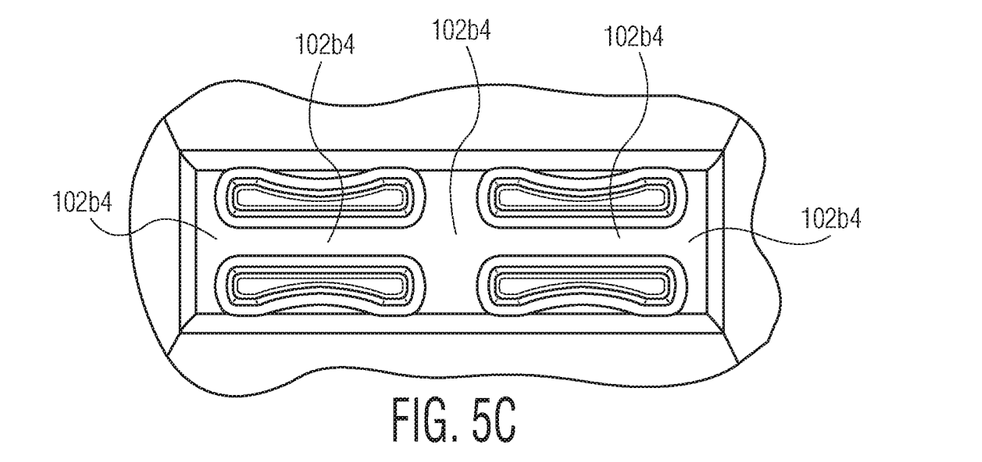
Figure 5D:
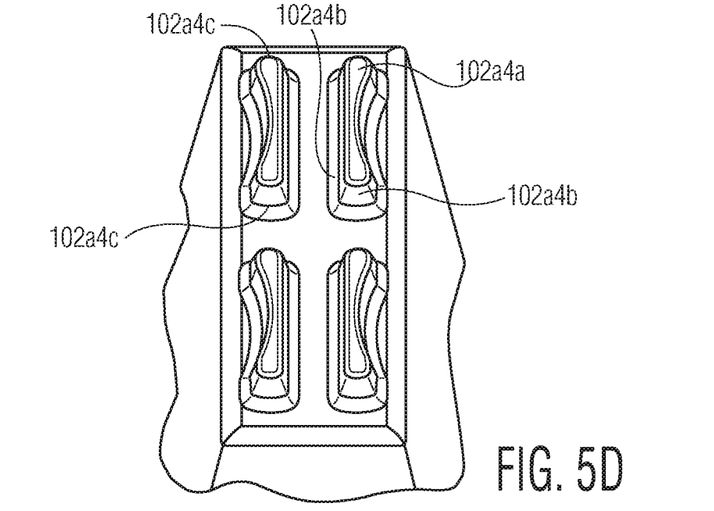
Figure 5E:
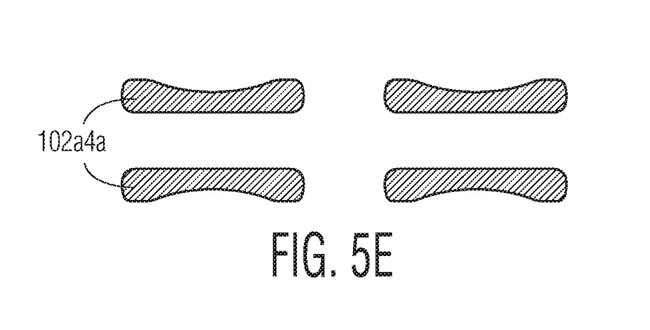
Figure 6A:
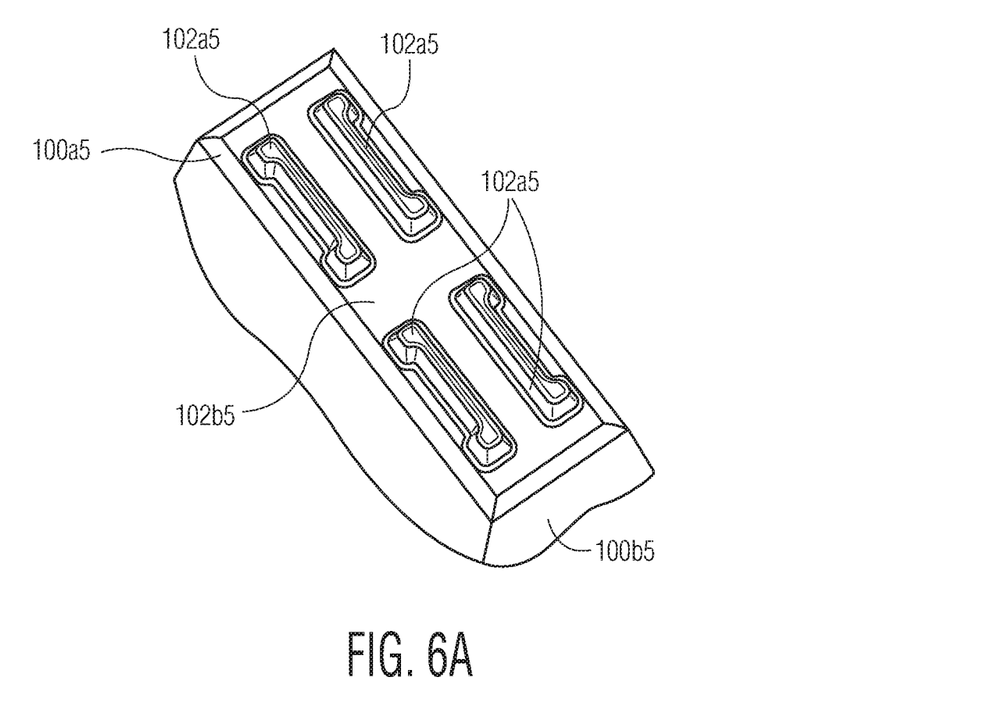
FIGS. 6A-6E are various views of a tip portion of yet another ribbon bonding tool in accordance with an exemplary embodiment of the invention.
Figure 6B:
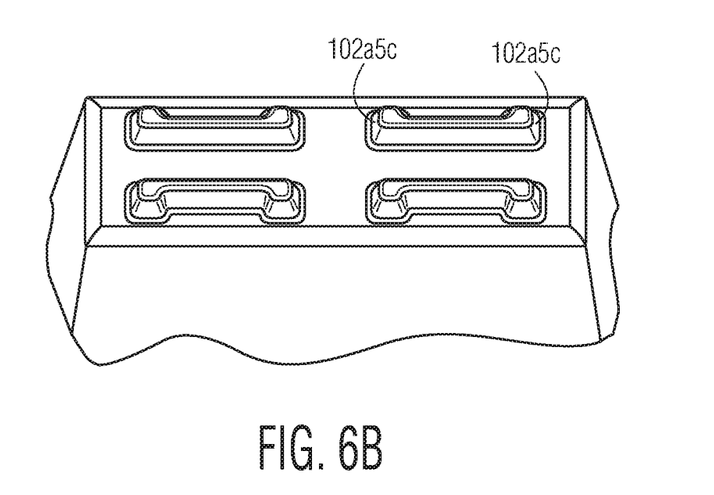
Figure 6C:
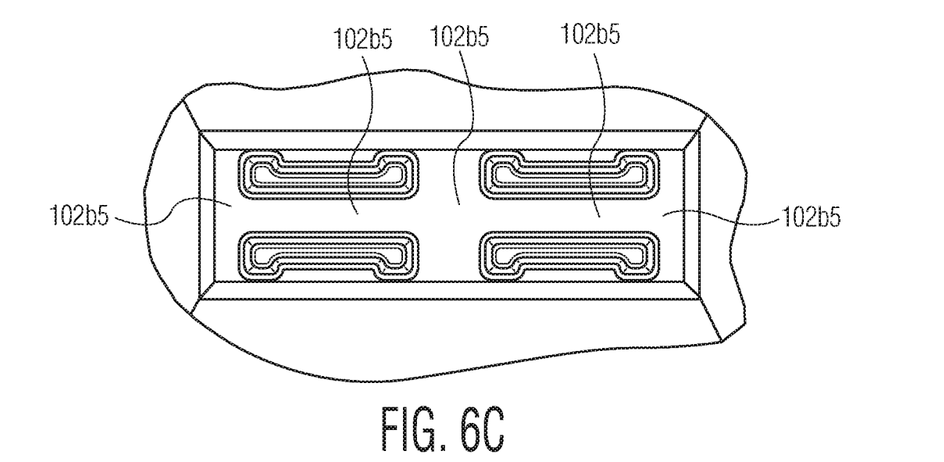
Figure 6D:
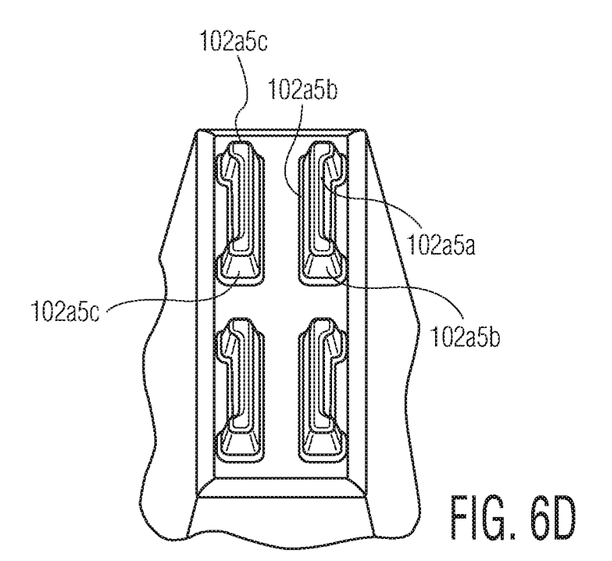
Figure 6E:
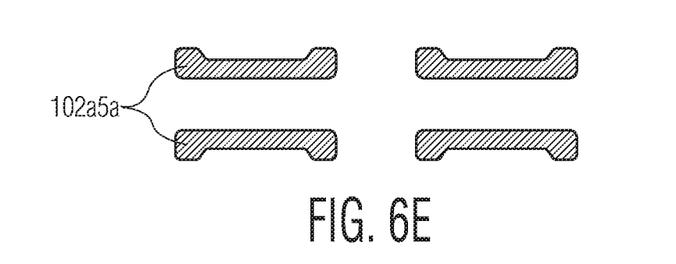

FIG. 2A is a perspective view of a tip portion 100b1 defining a working surface 100a1. Four elongate protrusions 102a1 extend from working surface 100a1. FIG. 2B is a top perspective view of tip portion 100b1; FIG. 2C is a top view of tip portion 100b1; FIG. 2D is another top perspective view of tip portion 100b1; and FIG. 2E is a top view illustration of protrusions 102a1. Areas 102b1 of working surface 100a1 away from protrusions 102a1 (e.g., between and/or around protrusions 102a1) are substantially planar. Each of the four protrusions 102a1 includes two side wall portions extending along a length of the protrusions, each of the two side wall portions following a substantially straight linear path. In FIGS. 2A-2E, each of the four protrusions 102a1 has an elongate structure extending between ends 102a1c, and a substantially planar contact surface 102a1a. Each of the four protrusions 102a1 includes tapered wall portions 102a1b extending along a height of the protrusions 102a1.

Tip portion 100b2 (defining a working surface 100a2) in FIGS. 3A-3E, and the views of tip portion 100b2, are very similar to tip portion 100b1 in FIGS. 2A-2E. Referring to FIGS. 3A-3E, areas 102b2 of working surface 100a2 away from elongate protrusions 102a2 are substantially planar. Each of the four protrusions 102a2 (having an elongate structure extending between ends 102a2c, and including a substantially planar contact surface 102a2a) includes one side wall portion following a substantially straight linear path, and another side wall portion following a curved path. Protrusions 102a2 include tapered wall portions 102a2b extending along a height of the protrusions 102a2.

Tip portion 100b3 (defining a working surface 100a3) in FIGS. 4A-4E, and the views of tip portion 100b3, are very similar to tip portion 100b1 in FIGS. 2A-2E. Referring to FIGS. 4A-4E, areas 102b3 of working surface 100a3 away from elongate protrusions 102a3 are substantially planar. Each of the four protrusions 102a3 (having an elongate structure extending between ends 102a3c, and including a substantially planar contact surface 102a3a) includes two side wall portions following a curved path. Protrusions 102a3 include tapered wall portions 102a3b extending along a height of the protrusions 102a3.

Tip portion 100b4 (defining a working surface 100a4) in FIGS. 5A-5E, and the views of tip portion 100b4, are very similar to tip portion 100b1 in FIGS. 2A-2E. Referring to FIGS. 5A-5E, areas 102b4 of working surface 100a4 away from elongate protrusions 102a4 are substantially planar. Each of the four protrusions 102a4 (having an elongate structure extending between ends 102a4c, and including a substantially planar contact surface 102a4a) includes one side wall portion following a substantially straight linear path, and another side wall portion following a curved path. Protrusions 102a4 include tapered wall portions 102a4b extending along a height of the protrusions 102a4.

Tip portion 100b5 (defining a working surface 100a5) in FIGS. 6A-6E, and the views of tip portion 100b5, are very similar to tip portion 100b1 in FIGS. 2A-2E. Referring to FIGS. 6A-6E, areas 102b5 of working surface 100a5 away from elongate protrusions 102a5 are substantially planar. Each of the four protrusions 102a5 (having an elongate structure extending between ends 102a5c, and including a substantially planar contact surface 102a5a) includes one side wall portion following a substantially straight linear path, and another side wall portion following a non-linear path. Protrusions 102a5 include tapered wall portions 102a5b extending along a height of the protrusions 102a5.

Figure 7:
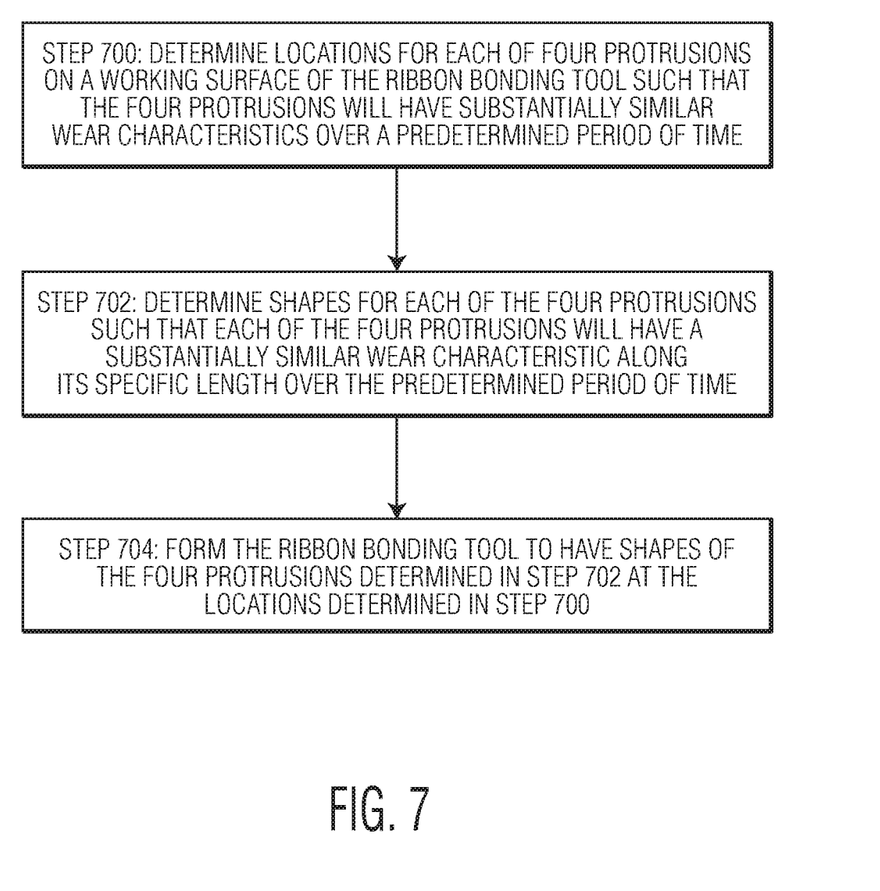
FIG. 7 is a flow diagram illustrating a method of designing a ribbon bonding tool in accordance with an exemplary embodiment of the invention.

FIG. 7 is a flow diagram in accordance with certain exemplary embodiments of the invention. As is understood by those skilled in the art, certain steps included in the flow diagram may be omitted; certain additional steps may be added; and the order of the steps may be altered from the order illustrated.

FIG. 7 is a flow diagram illustrating a method of designing a ribbon bonding tool in accordance with an exemplary embodiment of the invention. At Step 700, locations for each of four protrusions on a working surface of the ribbon bonding tool are determined such that the four protrusions will have similar (or substantially similar) wear characteristics over a predetermined period of time (e.g., the useable lifetime of the ribbon bonding tool). For example, experimentation may be done in connection with the application (e.g., a specific ribbon material, a specific bonding machine, specific bond process parameters, etc.) to determine how the bond foot of the ribbon bonding tool will wear. Through continued experimentation, desired locations for the protrusions can be determined. At Step 702, shapes for each of the four protrusions are determined such that each of the four protrusions will have a similar (or substantially similar) wear characteristic along its specific length over the predetermined period of time (e.g., the useable lifetime of the ribbon bonding tool). For example, shapes of the protrusions may be altered during experimentation to find shapes having similar (or substantially similar) wear characteristics along its length. At Step 704, the ribbon bonding tool is formed to have shapes of the four protrusions determined in Step 702 at the locations determined in Step 700. For example, a tip portion of a ribbon bonding tool formed from a unitary piece of material (e.g., a metal such as steel, tungsten carbide, a ceramic tip portion attached to a metal (e.g., tungsten carbide) body portion of the ribbon bonding tool, etc.) may be machined to form the desired shapes of the protrusions (e.g., using a process such as laser machining, electrical discharge machining, sinker EDM, etc.). Although the method illustrated in FIG. 7 has been described in connection with four protrusions (e.g., one protrusion in each quadrant, as described above), the steps shown in FIG. 7 may be used to design a ribbon bonding tool having more (or less) than four protrusions.

In accordance with certain exemplary embodiments of the invention, because of the substantially uniform wear of the four protrusions with respect to one another, and the substantially uniform wear across the area of each of the protrusions, the actual wear during the lifetime of the tool tends to not affect performance of the tool. This tends to be the case particularly if the sidewalls are substantially vertical, because the contact area does not significantly change during the lifetime of the tool.

As will be appreciated by those skilled in the art, the wear behavior of ribbon bonding tools may change significantly once the ribbon material comes into contact with the working surface (i.e., the horizontal plane) of the ribbon bonding tool. Thus, it would be desirable to predict the time when the ribbon material comes into contact with the working surface of the ribbon bonding tool. For example, certain signals may be monitored on a wire/ribbon bonding machine that provide an indication (a signature) of contact between the ribbon material and the working surface of the ribbon bonding tool. Upon detection of such an indication, a user of the machine may replace the ribbon bonding tool.

One signal that may be monitored to predict such an indication is ribbon material deformation. That is, when the protrusions/structures wear, the protrusions/structures penetrate the ribbon material to a lesser degree. The deformation caused by this reduced penetration can be measured (e.g., using a z-axis detection system associated with the bond head position of the wire/ribbon bonding machine).

Another option would be to include a feature on the working surface (e.g., in the center of the working surface) that, upon a certain amount of wear of the protrusions, results in an additional mark to become visible (e.g., the mark may become visible on the ribbon material being bonded) such that the user knows that it is time to replace the ribbon bonding tool. The mark may be detected, for example, using a camera of the wire/ribbon bonding machine. The imaging by the camera may be performed on a predetermined interval (e.g., after every thousand bonding cycles, etc.).

Bonding tools according to the invention may be formed from a single piece of material (e.g., where the body portion, including the tip portion, and including the protrusions on the tip portion, may be formed from a single piece of material). Bonding tools according to the invention may also be formed from two or more pieces (e.g., a tip portion formed of a piece of material coupled to a separate body portion). Further still, the protrusions described herein may be formed from the same piece of material as the remainder of the tip portion, or may be separates pieces of material attached to the working face of the tip portion. Additional implementations, within the scope of the invention, are contemplated.

Although the invention has been described primarily with respect to ribbon bonding tools it is not limited thereto. For example, the teachings of the invention may have applicability to other wire bonding tools (e.g., wedge bonding tools, ball bonding tools, etc.). Further, additional or different numbers of protrusions (e.g., a plurality of protrusions other than four) may be provided on the working surface of the ribbon bonding tool.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A ribbon bonding tool comprising:
   a body portion including a tip portion, the tip portion defining a working surface, the tip portion being configured to bond a portion of a ribbon material to a bonding location; and
   a group of four protrusions extending from the working surface, wherein the working surface defines four quadrants in a horizontal plane by extending an imaginary line at a midpoint along each of a length and a width of the working surface, each of the four protrusions being arranged in one of four quadrants,
   wherein each of the four protrusions includes two side wall portions extending along a length of the protrusions, each of the two side wall portions following a curved path.

2. The ribbon bonding tool of claim 1 wherein each of the four protrusions has an elongate structure and a substantially planar contact surface.

3. The ribbon bonding tool of claim 1 wherein each of the four protrusions includes tapered wall portions extending along a height of the protrusions.

4. The ribbon bonding tool of claim 1 wherein the body portion and the four protrusions are formed from a single piece of material.

5. The ribbon bonding tool of claim 1 wherein a center point of the working surface is substantially planar.

6. The ribbon bonding tool of claim 1 wherein each of the four protrusions are arranged equidistant from a center point of the working surface.

7. A ribbon bonding tool comprising:
   a body portion including a tip portion, the tip portion defining a working surface, the tip portion being configured to bond a portion of a ribbon material to a bonding location; and
   a group of four protrusions extending from the working surface, wherein each of the four protrusions are arranged equidistant from a center point of the working surface,
   wherein each of the four protrusions includes two side wall portions extending along a length of the protrusions, each of the two side wall portions following a curved path.

8. The ribbon bonding tool of claim 7 wherein each of the four protrusions has an elongate structure and a substantially planar contact surface.

9. The ribbon bonding tool of claim 7 wherein each of the four protrusions includes tapered wall portions extending along a height of the protrusions.

10. The ribbon bonding tool of claim 7 wherein the body portion and the four protrusions are formed from a single piece of material.

11. A ribbon bonding tool comprising:
    a body portion including a tip portion, the tip portion defining a working surface, the tip portion being configured to bond a portion of a ribbon material to a bonding location; and
    a group of four protrusions extending from the working surface, wherein the working surface defines four quadrants in a horizontal plane by extending an imaginary line at a midpoint along each of a length and a width of the working surface, each of the four protrusions being arranged in one of four quadrants, wherein each of the four protrusions includes two side wall portions extending along a length of the protrusions, wherein one of the two side wall portions follows a substantially straight linear path, and another of the two side wall portions follows a curved path.

12. The ribbon bonding tool of claim 11 wherein each of the four protrusions has an elongate structure and a substantially planar contact surface.

13. The ribbon bonding tool of claim 11 wherein each of the four protrusions includes tapered wall portions extending along a height of the protrusions.

14. The ribbon bonding tool of claim 11 wherein the body portion and the four protrusions are formed from a single piece of material.

15. The ribbon bonding tool of claim 11 wherein a center point of the working surface is substantially planar.

16. The ribbon bonding tool of claim 11 wherein each of the four protrusions are arranged equidistant from a center point of the working surface.

17. A ribbon bonding tool comprising:
   a body portion including a tip portion, the tip portion defining a working surface, the tip portion being configured to bond a portion of a ribbon material to a bonding location; and
   a group of four protrusions extending from the working surface, wherein each of the four protrusions are arranged equidistant from a center point of the working surface,
   wherein each of the four protrusions includes two side wall portions extending along a length of the protrusions, wherein one of the two side wall portions follows a substantially straight linear path, and another of the two side wall portions follows a curved path.

18. The ribbon bonding tool of claim 17 wherein each of the four protrusions has an elongate structure and a substantially planar contact surface.

19. The ribbon bonding tool of claim 17 wherein each of the four protrusions includes tapered wall portions extending along a height of the protrusions.

20. The ribbon bonding tool of claim 17 wherein the body portion and the four protrusions are formed from a single piece of material.

* * * * *